(12) United States Patent
Chang et al.

(10) Patent No.: US 9,337,182 B2
(45) Date of Patent: May 10, 2016

(54) METHOD TO INTEGRATE DIFFERENT FUNCTION DEVICES FABRICATED BY DIFFERENT PROCESS TECHNOLOGIES

(71) Applicant: Taiwan Semiconductor Manufacturing Co., Ltd., Hsin-Chu (TW)

(72) Inventors: Kuei-Sung Chang, Kaohsiung (TW); Chun-Wen Cheng, Zhubei (TW); Alex Kalnitsky, San Francisco, CA (US); Chia-Hua Chu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 396 days.

(21) Appl. No.: 13/729,281

(22) Filed: Dec. 28, 2012

(65) Prior Publication Data

US 2014/0183611 A1   Jul. 3, 2014

(51) Int. Cl.
*H01L 27/06* (2006.01)
*H01L 25/16* (2006.01)
*H01L 49/02* (2006.01)
*H01L 23/10* (2006.01)
*H01L 23/00* (2006.01)

(52) U.S. Cl.
CPC ............. *H01L 27/0629* (2013.01); *H01L 23/10* (2013.01); *H01L 25/16* (2013.01); *H01L 28/90* (2013.01); *H01L 24/05* (2013.01); *H01L 24/13* (2013.01); *H01L 24/14* (2013.01); *H01L 24/16* (2013.01); *H01L 24/29* (2013.01); *H01L 24/32* (2013.01); *H01L 24/73* (2013.01); *H01L 2224/0401* (2013.01); *H01L 2224/04026* (2013.01); *H01L 2224/04042* (2013.01); *H01L 2224/05624* (2013.01); *H01L 2224/05644* (2013.01); *H01L 2224/05647* (2013.01); *H01L 2224/131* (2013.01); *H01L 2224/13124* (2013.01); *H01L 2224/13144* (2013.01); *H01L 2224/14051* (2013.01); *H01L 2224/16268* (2013.01); *H01L 2224/29124* (2013.01); *H01L 2224/29144* (2013.01); *H01L 2224/32268* (2013.01); *H01L 2224/73103* (2013.01); *H01L 2924/19041* (2013.01); *H01L 2924/19104* (2013.01)

(58) Field of Classification Search
CPC ..................... H01L 2224/04026; H01L 24/31; H01L 25/162; H01L 28/92
USPC ........................... 257/304, 305, 307; 438/456
See application file for complete search history.

(56) References Cited

U.S. PATENT DOCUMENTS

| | | | |
|---|---|---|---|
| 6,876,554 B1 * | 4/2005 | Inagaki et al. | 361/763 |
| 7,271,476 B2 * | 9/2007 | Nishikawa et al. | 257/684 |
| 7,307,852 B2 * | 12/2007 | Inagaki et al. | 361/760 |
| 7,391,118 B2 * | 6/2008 | Tsai | 257/778 |
| 7,615,869 B2 * | 11/2009 | Koo et al. | 257/777 |
| 7,855,894 B2 * | 12/2010 | Inagaki et al. | 361/763 |
| 7,995,352 B2 * | 8/2011 | Inagaki et al. | 361/763 |
| 8,107,253 B2 * | 1/2012 | Inagaki et al. | 361/763 |
| 8,130,507 B2 * | 3/2012 | Origuchi et al. | 361/760 |
| 8,188,591 B2 | 5/2012 | Rassel et al. | |

(Continued)

*Primary Examiner* — Earl Taylor
(74) *Attorney, Agent, or Firm* — Eschweiler & Associates, LLC

(57) ABSTRACT

The present disclosure is directed to an apparatus and method for manufacture thereof. The apparatus includes a first passive substrate bonded to a second active substrate by a conductive metal interface. The conductive metal interface allows for integration of different function devices at a wafer level.

18 Claims, 4 Drawing Sheets

(56) References Cited

U.S. PATENT DOCUMENTS

| | | | |
|---|---|---|---|
| 8,331,102 B2* | 12/2012 | Inagaki et al. | 361/765 |
| 8,378,448 B2* | 2/2013 | Ding et al. | 257/531 |
| 8,546,188 B2* | 10/2013 | Liu et al. | 438/109 |
| 8,680,652 B2* | 3/2014 | Kim et al. | 257/532 |
| 8,780,573 B2* | 7/2014 | Inagaki et al. | 361/766 |
| 8,895,360 B2* | 11/2014 | Chang et al. | 438/109 |
| 2004/0087058 A1* | 5/2004 | Ooi et al. | 438/106 |
| 2005/0087850 A1* | 4/2005 | Nishikawa | H01L 23/50 257/678 |
| 2005/0157478 A1* | 7/2005 | Inagaki et al. | 361/763 |
| 2007/0258225 A1* | 11/2007 | Inagaki et al. | 361/763 |
| 2008/0055872 A1* | 3/2008 | Inagaki et al. | 361/760 |
| 2008/0142990 A1* | 6/2008 | Yu et al. | 257/777 |
| 2008/0158838 A1* | 7/2008 | Inagaki et al. | 361/761 |
| 2008/0158841 A1* | 7/2008 | Inagaki et al. | 361/782 |
| 2009/0051046 A1* | 2/2009 | Yamazaki et al. | 257/777 |
| 2009/0108403 A1 | 4/2009 | Gogoi | |
| 2009/0237900 A1* | 9/2009 | Origuchi et al. | 361/763 |
| 2010/0118502 A1* | 5/2010 | Inagaki et al. | 361/766 |
| 2010/0181645 A1* | 7/2010 | Marenco | 257/532 |
| 2010/0193954 A1* | 8/2010 | Liu et al. | 257/751 |
| 2010/0226108 A1* | 9/2010 | Inagaki et al. | 361/762 |
| 2011/0102657 A1* | 5/2011 | Takahashi et al. | 348/308 |
| 2011/0186978 A1* | 8/2011 | Kim et al. | 257/686 |
| 2011/0233785 A1* | 9/2011 | Koester et al. | 257/773 |
| 2011/0248396 A1* | 10/2011 | Liu | H01L 25/0657 257/686 |
| 2012/0012982 A1* | 1/2012 | Korec et al. | 257/533 |
| 2012/0032348 A1* | 2/2012 | Yu et al. | 257/777 |
| 2012/0112361 A1* | 5/2012 | Han et al. | 257/774 |
| 2012/0211865 A1* | 8/2012 | Tian | H01L 27/0805 257/532 |
| 2013/0107482 A1* | 5/2013 | Inagaki et al. | 361/763 |
| 2013/0161792 A1* | 6/2013 | Tran et al. | 257/534 |
| 2014/0035158 A1* | 2/2014 | Chang et al. | 257/774 |
| 2014/0145299 A1* | 5/2014 | Kalnitsky et al. | 257/532 |
| 2014/0183611 A1* | 7/2014 | Chang et al. | 257/301 |
| 2014/0247572 A1* | 9/2014 | Inagaki et al. | 361/763 |

* cited by examiner

METHOD TO INTEGRATE DIFFERENT FUNCTION DEVICES FABRICATED BY DIFFERENT PROCESS TECHNOLOGIES

BACKGROUND

A demand for smaller ICs with higher performance has led to the development of system-on-a-chip devices, where portions of the chip are dedicated to memory and other portions are dedicated to logic or other types of circuitry. However, it can be difficult to manufacture an IC with multiple types of circuitry, due to integration problems of the different circuit fabrication technologies.

DETAILED DESCRIPTION

Figure 1A:
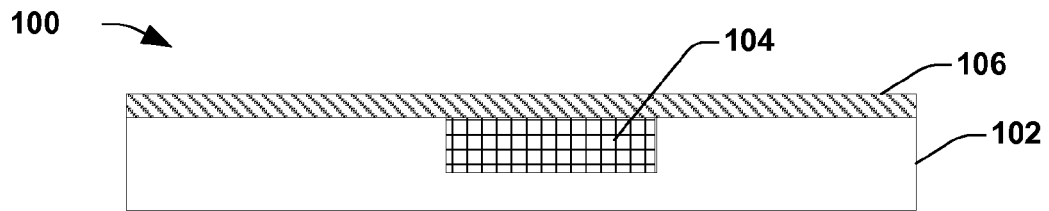
FIGS. 1A-1L are partial cross sectional views illustrating steps of one embodiment of forming an apparatus in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

In current VLSI technology integration schemes, CMOS chips having active devices are mounted directly onto a substrate or ground plane using through wafer/silicon vias (TSVs) or interposers that are utilized by the CMOS chip for signals to connect to the substrate or ground plane. Depending on the integration scheme, other chips having integrated passive device are mounted either directly on the substrate or ground plane, or on the CMOS chip having active devices such as, for example, micro-controller or power amplifiers. Usually the active devices are more advanced technology nodes than the integrated passive device chips. In either implementation, the wire bonds are usually provided between chips having active devices and chips having passive devices, to function as signal lines there between, with the use of bond pads placed about a perimeter of the active devices on the CMOS chips.

Long wire bond leads add high inductance and resistance out of the active devices on the CMOS chips. Additionally, the use of wire bonds adds to poor thermal properties for heat transfer. Moreover the use of bond pads on the perimeter of the active devices on the CMOS chip, in order to connect the wire bond leads from the active devices to the signal lines, is a poor utilization of valuable real estate. This leads to less flexible designs and higher design and/or manufacturing costs.

Accordingly, the present disclosure is directed to an apparatus and a wafer-level manufacturing method of forming the apparatus which integrates passive and active devices through a conductive metal interface, eliminating the necessity for external electrical paths, such as by wire bonding, while providing minimized and stable parasitics.

FIGS. 1A-1L illustrate a plurality of partial cross section diagrams illustrating one embodiment of a method of forming an apparatus having a conductive metal interface for bonding of substrates having active and passive devices at stages in the manufacturing process according to the disclosure. Referring to FIG. 1A, a first substrate 102 having a conductive region 104 is provided. First substrate 102 is understood to include a semiconductor wafer or substrate, comprised of a semiconducting material such as silicon, a silicon-on-insulator structure (SOI), Ge, SiC, GaAs, GaAlAs, InP, GaN, or SiGe. Conductive regions can be formed by introducing impurities into certain areas of substrate 102. Any suitable process like implantation or thermal diffusion can achieve the formation of the conductive area 104.

A hard mask layer 106 is disposed over the substrate 102. In one embodiment, hard mask layer 106 can include one or more layers. Any suitable material or combination of materials can be used. In one embodiment, hard mask layer 106 is silicon oxide. Examples of other materials that may be suitable for the hard mask layer 106 include without limitation, silicon nitride and SiON. The hard mask layer 106 can be formed by any suitable process or combination of processes.

Figure 1B:
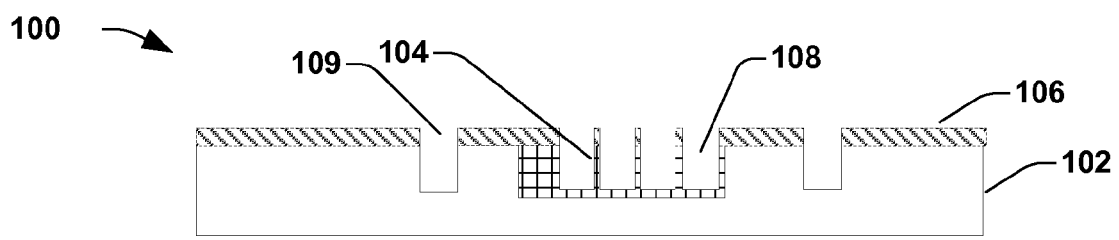

The hard mask layer 106 is then coated with a photoresist layer and then selectively exposed according to a desired pattern and developed. The patterned photoresist is then used as a mask to etch the hard mask layer 106 and transfer the trench pattern from the photoresist layer to the hard mask layer 106. The photoresist can then be stripped and an etching process performed to etch conductive region 104 (see trenches 108) and to etch substrate (see trenches 109), forming a plurality of trenches therein. Any suitable etch process can be used. A suitable etch process is typically a plasma etch. FIG. 1B illustrates the resulting structure. In one embodiment, the hard mask layer 106 can be removed after the trench formation. In another embodiment, the hard mask layer 106 is kept after trench formation and integrated with a subsequently deposited dielectric layer.

Figure 1C:
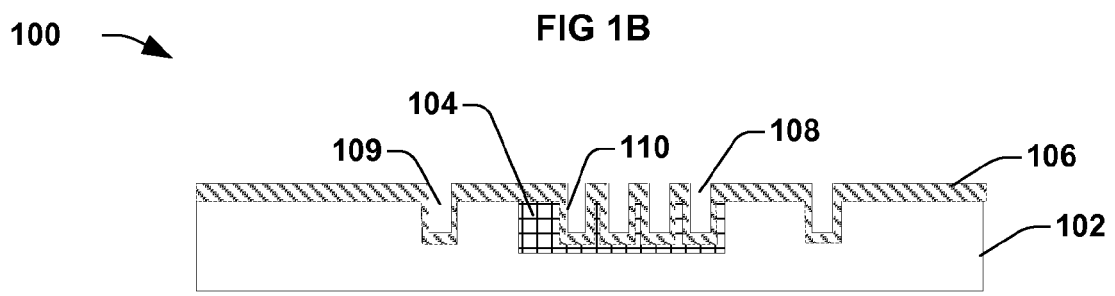

In FIG. 1C a dielectric layer 110 is conformally deposited to line trenches 108, 109 and the etched conductive region 104 in FIG. 1B. The dielectric layer 110 can be formed from one or more layers of any suitable dielectric(s). In one embodiment, dielectric layer 110 can include tetraethoxysilane (TEOS) oxide, silicon oxide, SiON, and SiN. The dielectric layer 110 can be formed by any suitable process or combination of processes, such as low pressure chemical vapor deposition (LPCVD) or plasma-enhanced chemical vapor deposition (PECVD). In one embodiment, where a thicker dielectric layer is required, a thicker dielectric layer 110 can be deposited and not only line the trenches 108 but also cover the top surface of substrate 102.

Figure 1D:
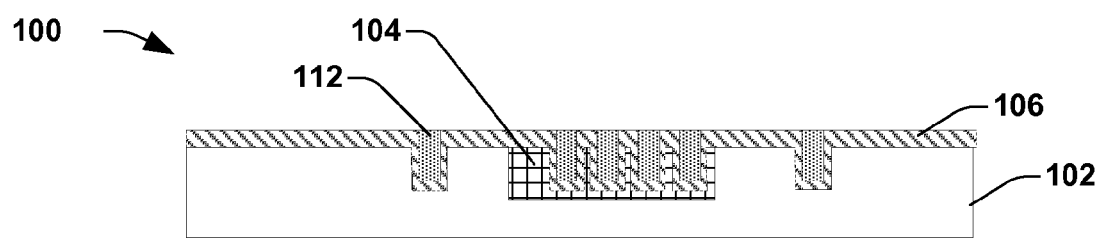

A conductive material 112 is deposited in FIG. 1D. The conductive material 112 fills the trenches 108 and 109. In general, any suitable conductive material or combination of materials can be utilized for the conductive material 112. Examples of conductive materials that can be used include doped semiconductors, metals, and metallic compounds. Examples of metals that can be used include, without limitation, tungsten, titanium, tantalum, ruthenium, cobalt, copper, aluminum, lead, platinum, tin, silver, and gold. Examples of metallic compounds that can be used include, without limitation, tantalum nitride, titanium nitride, tungsten silicide, tungsten nitride, titanium nitride, tantalum nitride, ruthenium oxide, cobalt silicide, and nickel silicide. In one embodiment, the conductive material 112 comprises a doped polysilicon. The conductive material 112 can be deposited by any suitable process or combination of processes such as chemical vapor deposition (CVD) or thermal oxidation. The conductive material 112 can fill the trenches 108 and overlay the trenches so as to cover the substrate 102. Following deposition of the conductive material 112, a planarization of the conductive material is performed, such as by chemical/mechanical planarization (CMP) or etching, down to the top surface of dielectric layer 106 (if not removed) to arrive at structure illustrated in FIG. 1D.

Figure 1E:
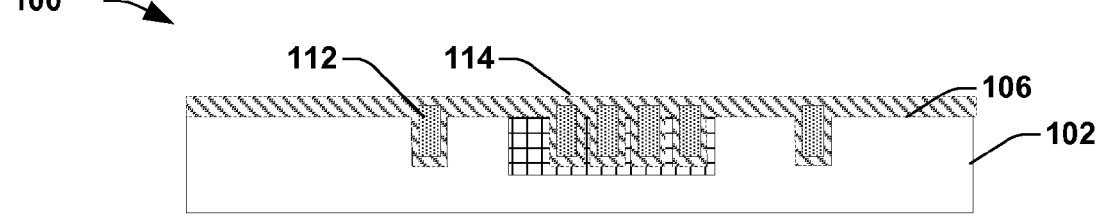

In FIG. 1E a surface oxidation process forms a dielectric oxide layer 114 over the conductive material 112 and the trenches 108 and over exposed surfaces of the semiconductor substrate 102. The dielectric layer 114 may have a thickness of between 5 nm and 5 um, in one embodiment. Another patterning step is then carried out to provide a contact via mask, and in FIG. 1F, an etch process is performed to form vias through the dielectric oxide layer 114. The vias are then filled with metal to form contacts 116. The contacts 116 form an electrical connection with conductive material 112 or conductive region 104.

Figure 1F:
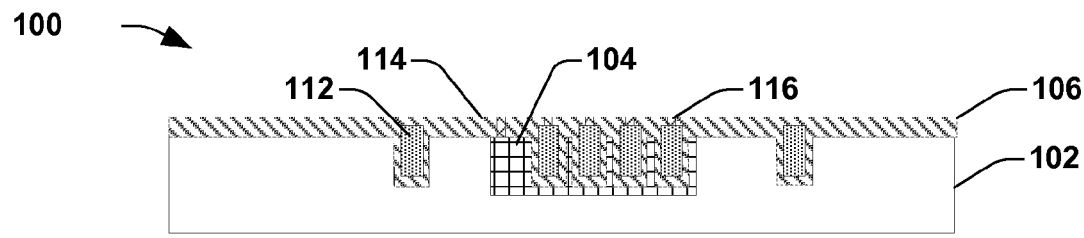

The metals filling the vias to form contacts 116 can be filled to overlay surface of the dielectric layer 106. Planarization of the metal, such as by chemical mechanical polishing (CMP), down to the top surface of the dielectric layer 106 is then performed to expose upper metal surface. A cleaning processes, such as to remove copper oxides, may also be employed. As can be seen in FIG. 1F, the vias 116 serve as electrical interconnects to the conductive material 112 or conductive region 104.

Figure 1G:
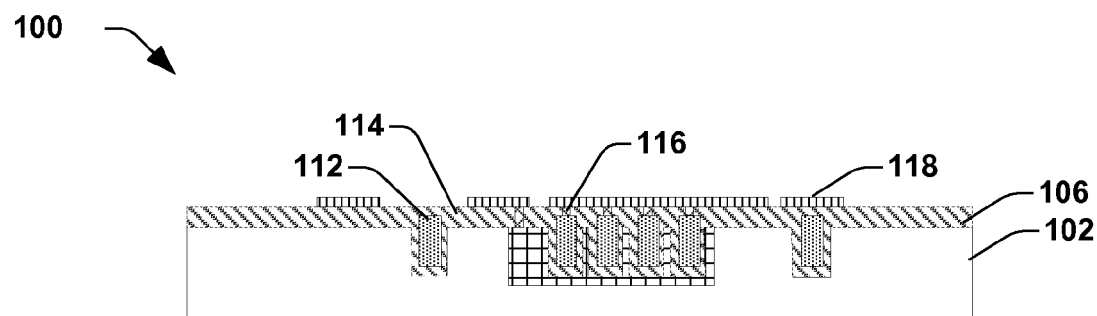

In FIG. 1G a first metal bond pattern 118 is then formed in at least one planar layer overlying contacts 116 formed within dielectric layer 106. Bond pattern 118 can include, in one embodiment, a metal such as aluminum, copper, Au, or combinations thereof. Bond pattern 118 is formed by depositing a metal layer and then forming a photoresist mask over the metal layer. Photoresist is selectively exposed according to the desired pattern and developed. The patterned photoresist is then used as a mask to etch the metal layer and form the bond pattern 118.

Figure 1H:
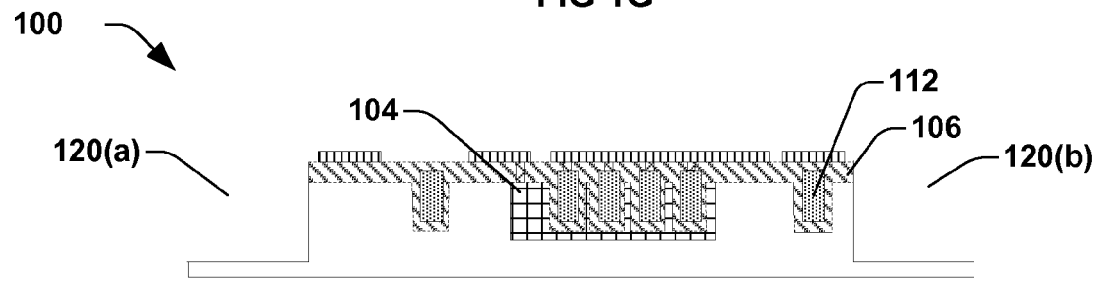

In FIG. 1H, openings 120(a), 120(b) are formed in the first substrate 102 by etching through dielectric layer 106 and substrate 102. Thus, FIG. 1H depicts the first substrate 102 which has one or more trench-type capacitors formed thereon. A lower capacitor plate of trench capacitors is formed by conductive region 104, and upper capacitor plate is formed by conductive material 112 within a respective trench 108, 109. As these layers are separated by a dielectric surrounding the conductive material 112 and disposed between the upper plate and lower plate, they act as capacitors, which are made using a first process.

Figure 1I:
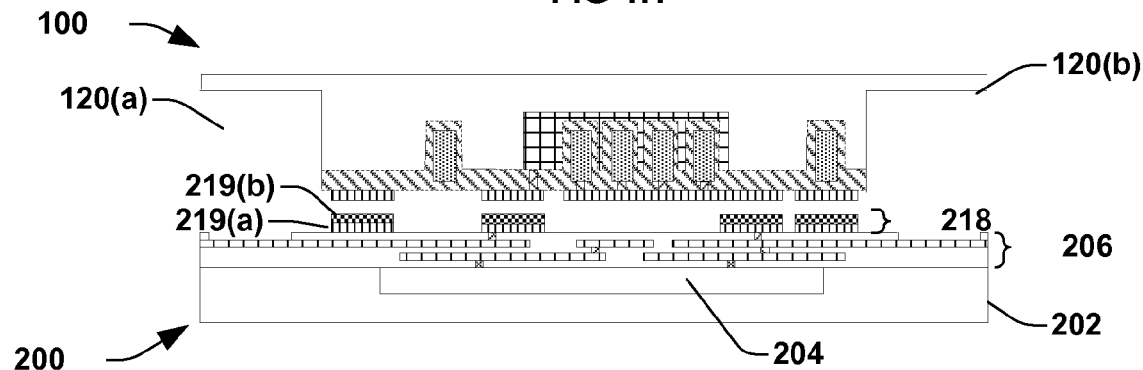
Figure 1J:
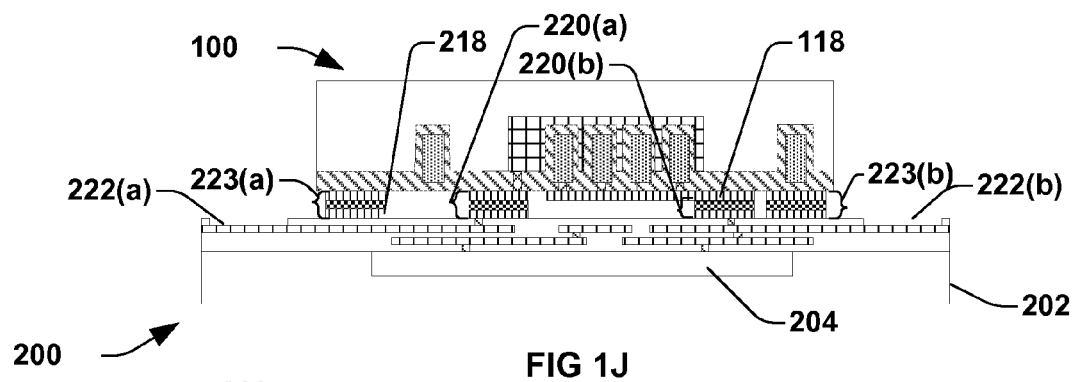

In FIG. 1I a second substrate 200 is provided. Second substrate 200 can include, in one embodiment, an active device 204 within the substrate 202, for example, a CMOS device. Interconnect layers 206 overly substrate 202 and active device 204. Second substrate 202 includes a second metal bond pattern 218 formed in at least one planar layer and is disposed overlying the interconnect layers 206. In one embodiment, second metal bond pattern 218 is formed from a metal including aluminum, copper, germanium, Au or combinations thereof. In one embodiment, second metal bond pattern 218 includes a first metal layer 219(a) and a second metal layer 219(b), with the first metal layer 219(a) including aluminum, copper, gold or germanium and combinations thereof, and the second metal layer 219(b) including germanium, aluminum, gold or combinations thereof. An annealing process is then performed to bond first metal bond pattern 118 of first substrate 100 with second metal bond pattern 218 of second substrate 200 and form conductive metal interface 220 to couple the capacitors to the CMOS devices, as illustrated in FIG. 1J. The first and second metal bond patterns form conductive metal interfaces 220(a), 220(b) having an Al—Al bond, a Au—Au bond, a Au—Ge bond, an Al—Ge bond, a Cu—Cu bond or a Cu—Ge bond. Annealing can be performed, in one embodiment, at a temperature of from about 100° C. to about 500° C.

After the bonding process, contact pads 222(a), 222(b) are then exposed by etching or grinding the remaining first substrate 100 at areas of openings 120(a) and 120(b). In one embodiment, contact pads 222(a), 222(b) can be formed on the substrate 202 before bonding process, by revealing certain portions of upper metal layer of interconnect layers 206. In another embodiment, contact pads 222(a), 222(b) can also be formed after bonding process, by the process revealing portion of the upper metal layer of interconnect layers after the grinding of the substrate 100.

Figure 1K:
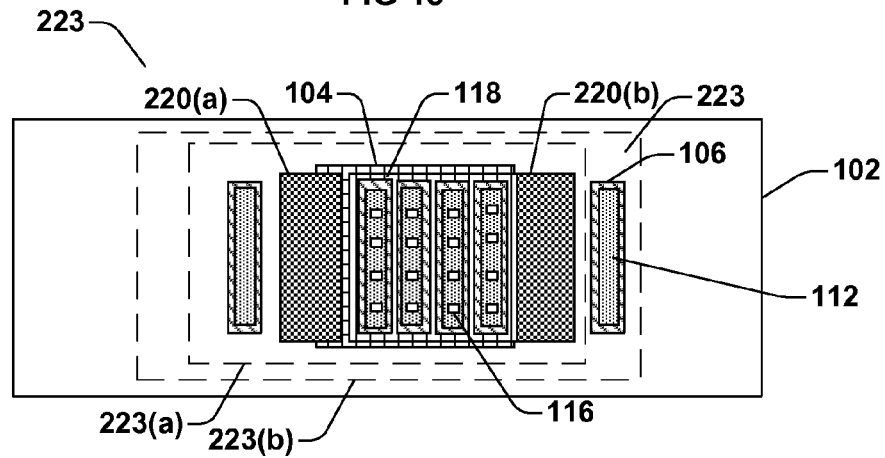

In FIG. 1K there is illustrated a top view of FIG. 1J, in which a closed loop seal ring 223 is formed to enclose inner conductive metal interface 220(a), 220(b). Closed loop seal ring 223 is illustrated by dotted lines and includes an inner perimeter 223(a) and an outer perimeter 223(b). Closed loop seal ring 223 seals and protects inner conductive metal interface 220(a), 220(b) from moisture or other chemical agents which may be utilized in subsequent processing.

Figure 1L:
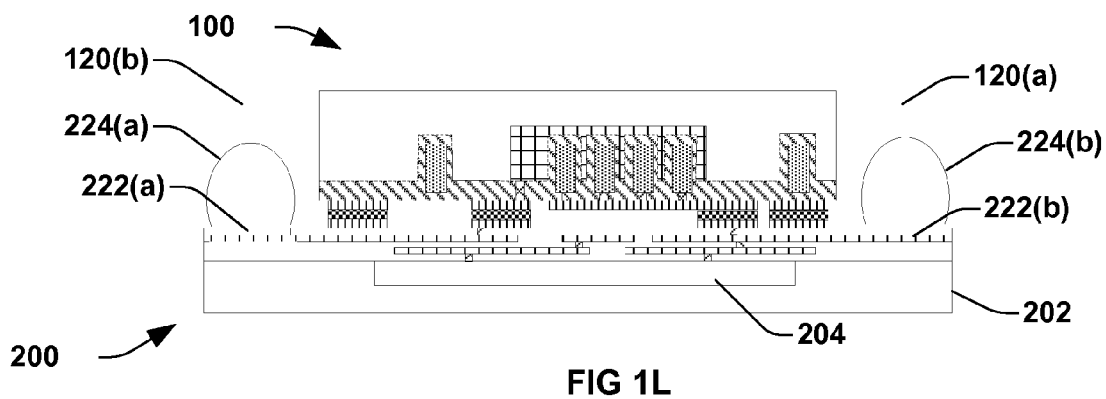

In FIG. 1L contact pads 222(a), 222(b) are connected to an external circuit. In one embodiment, connection can be made through solder bumps 224(a), 224(b) formed on contact pads 220(a), 220(b), as illustrated. In another embodiment, electrical connection to an external circuit can be made through a wire formed by wire bonding.

Figure 2:
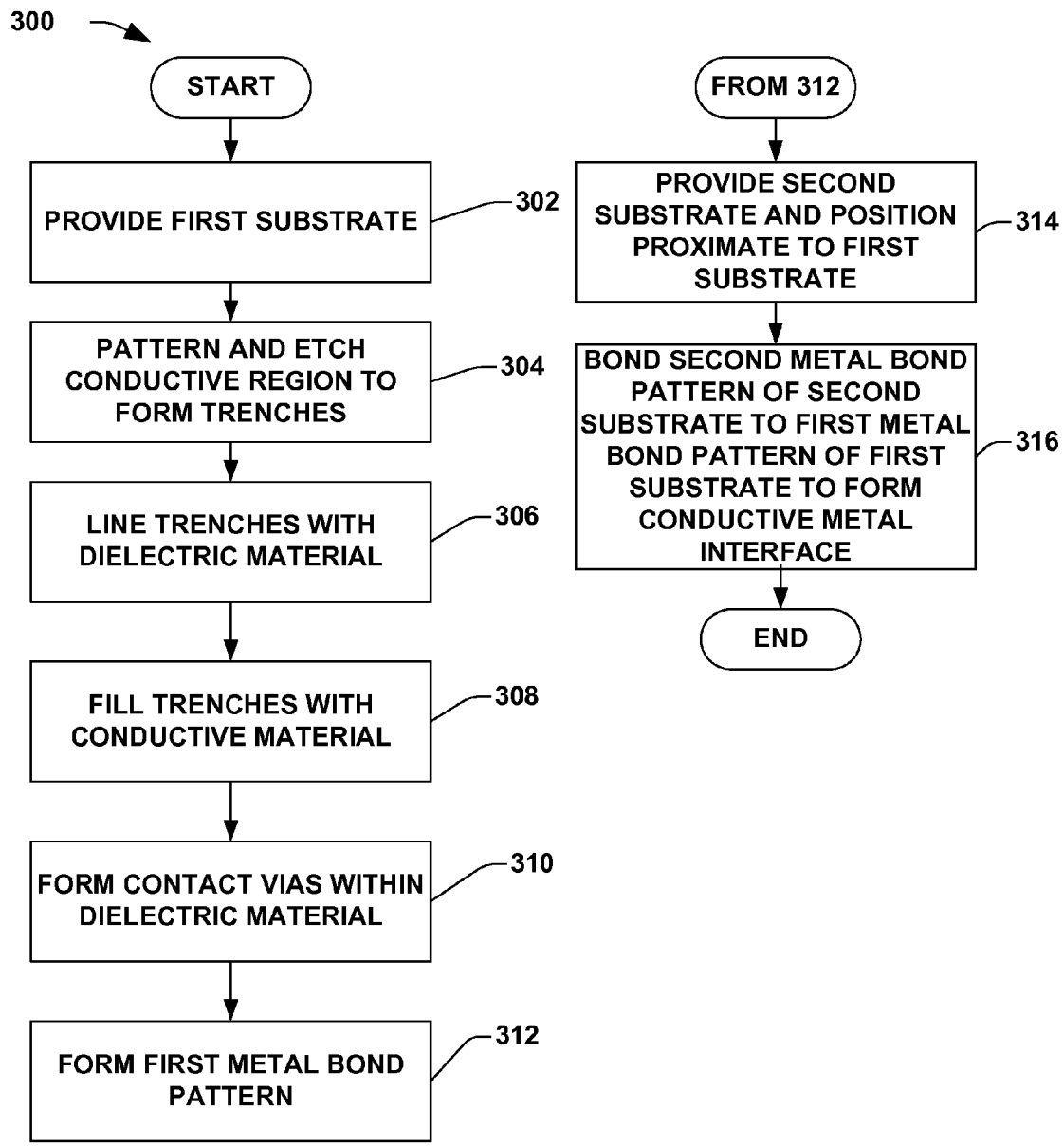
FIG. 2 illustrates a flow diagram of some embodiments of a method for the fabrication of the apparatus in accordance with the disclosure.

FIG. 2 illustrates a flow diagram of some embodiments of a method 300 for formation of a device according to an embodiment of the invention. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a first substrate with a conductive region is provided. At step 304, the conductive region is patterned and etched to form a plurality of trenches in the conductive region. This conductive region can act as a first capacitor plate, in some embodiments.

At step 306, a dielectric layer is deposited overlying the substrate and lining the trench. A conductive material is then deposited in the trench at step 308. This dielectric layer can act as a capacitor dielectric, and the conductive material can act as a second capacitor plate, in some embodiments.

At step 310, at least one contact via is formed to provide electrical connection to the conductive material.

A first metal bond pattern is then formed overlying the contact vias in step 312, and is thereby electrically connected to the trench capacitor.

At step 314, a second substrate having a second metal bond pattern corresponding to the first metal bond pattern of the first metal substrate is positioned proximate to the first substrate. The second substrate can be formed by a different process technology than the first substrate. For example, if the first substrate undergoes a simple trench capacitor manufacturing process, the second substrate can undergo a more complicated CMOS process that forms an active device thereon.

At step 316, second metal bond pattern and first metal bond pattern are bonded together, forming a conductive metal interface. This conductive metal interface electrically connects devices on the first substrate, for example, a trench capacitor formed by first process to a device on the second substrate, for example a CMOS device. Therefore, this methodology provides an efficient way to electrically couple substrates and/or devices formed by different process technologies to one another.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to an apparatus comprising a first substrate comprising at least a passive device comprising a capacitor, the compactor including an upper plate and a lower plate with a dielectric therebetween. The first substrate includes a first metal bond pattern thereon. The device further includes a second substrate comprising an active device and having a second metal bond pattern thereon. The second metal bond pattern of the second substrate corresponds to the first metal bond pattern of the first substrate and the first and second metal bond patterns collectively forming a conductive metal interface. The second active device is bonded to the first passive device at the conductive metal interface.

The disclosure further relates to a method of forming an apparatus comprising providing a first substrate having a conductive region thereon and patterning and etching the conductive form at least one trench therein. The method further comprises depositing a dielectric layer overlying the substrate and lining the at least one trench followed by filling the at least one opening with a conductive material. The method further comprises forming at least one contact via to provide electrical connection to conductive material and forming a first metal bond pattern in at least one planar layer overlying one or more contact vias. The method further comprises providing a second substrate and positioning the second substrate proximate to the first substrate, wherein the second substrate includes a second metal bond pattern thereon corresponding to the first metal bond pattern of the first substrate and then bonding the second metal bond pattern of the second substrate to the first metal bond pattern of the first substrate to form a conductive metal interface.

The disclosure further relates to a device comprising a first substrate comprising a first trench capacitor and having a first metal bond pattern thereon. The device further comprises a second substrate comprising a CMOS device and having a second metal bond pattern thereon. The second metal bond pattern of the second substrate corresponds to the first metal bond pattern of the first substrate. The first and second metal bond patterns collectively form a conductive metal interface with the second active substrate being bonded to the first passive substrate at the conductive metal interface. The device further includes a seal ring enclosing the conductive metal interface.

What is claimed is:

1. An apparatus comprising:
a first semiconductor substrate comprising at least a passive device comprising a capacitor, and including a first metal bond pattern thereon, wherein the capacitor comprises an upper plate and a lower plate with a dielectric therebetween; and
a second substrate comprising an active device, and including a second metal bond pattern thereon, the second metal bond pattern corresponding to the first metal bond pattern, the first and second metal bond patterns collectively forming a conductive metal interface, and the active device being bonded to the passive device at the conductive metal interface; and
a seal ring arranged under the first substrate and laterally surrounding the conductive metal interface.

2. The apparatus of claim 1, wherein the metal of the first metal bond pattern comprises aluminum, copper, gold, germanium, or combinations thereof.

3. The apparatus of claim 1, wherein the first semiconductor substrate includes a conductive region therein and a plurality of openings within the conductive region and the first semiconductor substrate, wherein the conductive region defines the upper plate, wherein the openings comprise trenches having a conductive material therein, and wherein the conductive material defines the lower plate.

4. The apparatus of claim 1, wherein the first metal bond pattern is arranged in at least one planar layer on a lower side of the first semiconductor substrate and vertically spaced from the first semiconductor substrate by a dielectric oxide layer, and wherein one or more contact vias are arranged in the dielectric oxide layer.

5. The apparatus of claim 1, wherein the conductive metal interface comprises an aluminum-aluminum bond, a gold-gold bond, a gold-germanium bond, an aluminum-germanium bond, a copper-copper bond, or a copper-germanium bond.

6. The apparatus of claim 1, wherein the active device is arranged within the second substrate, and wherein an interconnect layer is arranged over the second substrate and the active device.

7. The apparatus of claim 6, further comprising a contact pad arranged within an opening in the interconnect layer.

8. The apparatus of claim 7, wherein the contact pad is aligned with an opening in the first semiconductor substrate, and wherein the contact pad is connected to an external circuit through a solder bump arranged in the opening in the interconnect layer.

9. The apparatus of claim 6, wherein the second metal bond pattern is arranged in at least one planar layer and arranged over the interconnect layer of the second substrate.

10. An apparatus comprising:
a first semiconductor substrate comprising at least a passive device comprising a capacitor, and including a first metal bond pattern thereon, wherein the capacitor comprises an upper plate and a lower plate with a dielectric therebetween; and
a second substrate comprising an active device, and including a second metal bond pattern thereon, the second metal bond pattern corresponding to the first metal bond pattern, the first and second metal bond patterns collectively forming a conductive metal interface, and the active device being bonded to the passive device at the conductive metal interface;

wherein the first semiconductor substrate comprises a trench-type capacitor, wherein the upper plate comprises a conductive material within a respective trench, the dielectric surrounding the conductive material and disposed between the upper plate and the lower plate, wherein the second substrate comprises a complementary metal-oxide-semiconductor (CMOS) device, and wherein the conductive metal interface couples the trench-type capacitor to the CMOS device.

11. A device comprising:

a first substrate comprising a trench capacitor, and having a first metal bond pattern thereon;

a second substrate comprising a complementary metal-oxide-semiconductor (CMOS) device, and having a second metal bond pattern thereon, the second metal bond pattern corresponding to the first metal bond pattern, the first and second metal bond patterns collectively forming a conductive metal interface, and the second substrate being bonded to the first substrate at the conductive metal interface; and a seal ring laterally surrounding the conductive metal interface.

12. The device of claim 11, wherein the first substrate has a first cross-sectional width that is less than a corresponding second cross-sectional width of the second substrate, such that the second substrate has a ledge arising from a difference between the first and second cross-sectional widths, and further comprising:

a conductive contact area arranged on the ledge and being operably coupled to the CMOS device.

13. The device of claim 12, further comprising:

a solder bump or wire bond arranged on the ledge to operably couple the CMOS device to an external circuit.

14. A device, comprising:

one or more trenches recessed over a lower surface of a first substrate;

a doped region in the first substrate proximate to the one or more trenches and corresponding to a first trench capacitor plate;

one or more conductive bodies in the one or more trenches, respectively, and corresponding to a second trench capacitor plate;

a capacitor dielectric lining the one or more trenches and separating the first and second trench capacitor plates;

a first metal bond pattern underlying the one or more conductive bodies and having a planar lower surface;

at least one via extending vertically to couple lower regions of the one or more conductive bodies to an upper portion of the first metal bond pattern; and a second metal bond pattern proximate to the planar lower surface of the first metal bond pattern, wherein the first and second metal bond patterns collectively establish a conductive metal interface and bond the first substrate to a second substrate, and wherein the second substrate is arranged under the second metal bond pattern;

wherein an active complementary metal oxide semiconductor (CMOS) device is arranged on the second substrate.

15. The device of claim 14, wherein the first substrate has a first cross-sectional width that is smaller than a corresponding second cross-sectional width of the second substrate, such that the second substrate has a ledge arising from a difference in the first and second cross-sectional widths, and further comprising:

a conductive contact area arranged on the ledge and being operably coupled to the CMOS device.

16. The device of claim 15, further comprising:

a solder bump or wire-bond arranged on the ledge to operably couple the CMOS device to an external circuit.

17. The device of claim 16, further comprising a closed loop seal ring laterally surrounding the conductive metal interface.

18. The apparatus of claim 1, wherein the capacitor is a trench-type capacitor.

* * * * *